SEMICONDUCTOR DEVICES

Filed Feb. 1, 1954 2 Sheets-Sheet 1

INVENTOR.
Jacques I. Pankove
BY J. C. Whittaker
ATTORNEY

Dec. 2, 1958 J. I. PANKOVE 2,863,056

SEMICONDUCTOR DEVICES

Filed Feb. 1, 1954 2 Sheets-Sheet 2

INVENTOR.
Jacques I. Pankove

BY J. L. Whittaker
ATTORNEY

United States Patent Office 2,863,056

Patented Dec. 2, 1958

2,863,056

SEMICONDUCTOR DEVICES

Jacques I. Pankove, Princeton, N. J., assignor to Radio Corporation of America, a corporation of Delaware Application February 1, 1954, Serial No. 407,397

11 Claims. (Cl. 250—36)

This invention relates to semiconductor devices and systems and particularly to switch-type semiconductor devices and systems.

Many types of switching or triggering circuits are well known in the electronic arts. Electron tubes such as thyratrons and those having negative resistance characteristics are also used for performing these functions. Semiconductor materials and semiconductor devices have many favorable characteristics especially advantageous for accomplishing many of the aforementioned functions previously effected by electron tubes.

Accordingly, an important object of this invention is to provide a semiconductor device and system of new and improved form.

A further object of this invention is to provide an improved semiconductor device suitable for switching or triggering operations.

Another object of this invention is to provide an improved negative resistance semiconductor device and system.

Another object of this invention is to provide a negative resistance semiconductor device and system providing an oscillator with a minimum of associated circuitry.

A further object of this invention is to provide a semiconductor device and system having some characteristics of thyratron-type systems and devices.

In general the purposes and objects of this invention are accomplished by a body of semiconductor material having a rectifying electrode in operative relation therewith. A voltage is applied across the body and a bias voltage is applied to the rectifying electrode such that it is initially electrically biased in the reverse direction with respect to the portion of the semi-conductor body in the vicinity of the electrode. When the rectifying electrode becomes electrically biased in the forward direction with respect to the body, for example, by the application of a signal voltage either to the rectifying electrode or across the body, the electrode acts as an emitter and injects minority charge carriers into the body. The minority charge carriers reduce the resistivity of the body thereby lowering the voltage in the region of injection whereby current flow from the rectifying electrode increases to a maximum which is determined by the resistance in the external circuit of the rectifying electrode and in the portion of the body associated therewith.

Thus, the device of the invention may be employed as a switch and may be operated either as a negative resistance device or as a device having some characteristics of thyratron-type devices. According to another aspect of the invention, a negative resistance semiconductor device is employed as a photocell.

The invention is described in greater detail by reference to the drawings wherein.

Similar elements are designated by similar reference characters throughout the drawing.

Figure 1:
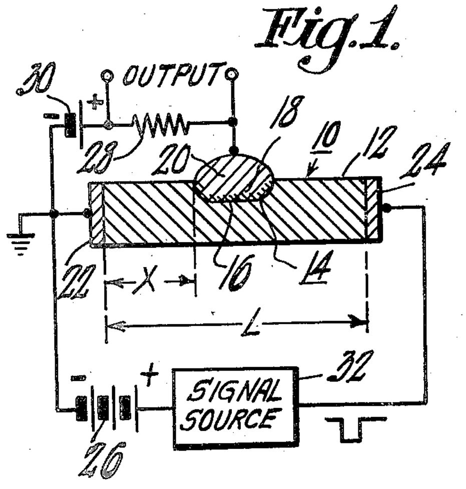
Fig. 1 is a sectional elevational view of a device and a schematic diagram of a circuit embodying the principles of the invention.

Referring to Figure 1, a semiconductor device 10 embodying the principles of the invention, comprises a body 12 of semiconductor material, for example germanium or silicon of N-type or P-type conductivity. The semiconductor body will be assumed, in the following example, to be N-type germanium, and may be in the form of a cylindrical rod, filament, plate or the like. A rectifying electrode 14 is in operative relation with the body 12 and may comprise a small-area electrode such as a point or line contact or a large-area electrode such as a plate or film or a P-N junction electrode. A P-N junction electrode is preferred, and may be formed by an alloying or fusion process as disclosed by Charles W. Mueller in a co-pending U. S. patent application, Serial Number 295,304, filed June 24, 1952, and assigned to the assignee of this application. According to the method described in the said Mueller application, a disk or pellet of a so-called impurity material, e. g. indium, is placed in contact with a selected surface of the block 12 of N-type germanium. The assembly of block and pellet is heated in an atmosphere of hydrogen, or an inert gas such as argon. The heating is effected at a temperature sufficient to cause the pellet to melt and alloy with the germanium block to form the P–N junction. A P–N junction formed according to this method includes a rectifying barrier 16, a thin layer of P-type material 18, and a region 20 adjacent thereto comprising an indium-germanium alloy.

With a body of N-type germanium, the impurity material may comprise one or more acceptor substances such as indium, aluminum, gallium, boron or zinc. If the semiconductor body is of P-type germanium, the impurity material may comprise one or more donor substances such as arsenic, bismuth, antimony, sulfur, selenium, tellurium or phosphorus.

After the P–N junction electrode has been formed in the semiconductor body 12, a pair of electrodes 22 and 24 are bonded to the body in low resistance or ohmic contact, with an electrode positioned substantially at each end of the body. The electrodes may be in the form of plates, tabs, disks or the like and are adapted not to inject minority charge carriers into the body.

The device 10 shown in Figure 1, may be operated in a circuit to provide a negative resistance characteristic.

This circuit includes a first battery 26 connected between the ohmic contact electrodes 22 and 24 ao establish a current path through the semi-conductor crystal and to provide the desired voltage distribution along the length of the crystal 12. The negative terminal of the battery is connected to the electrode 22 and to ground and the positive terminal is connected to the electrode 24. The P–N junction electrode is connected through a load device, for example a resistor 28, to the positive terminal of a second battery 30, the negative terminal of which is grounded. The voltage of the battery 30 is of such a magnitude that the electrode 14 is biased in the reverse direction or negative with respect to the portion of the semiconductor crystal adjacent thereto.

The expression for the voltage of the body, $V_x$, in the vicinity of the junction electrode 14 is $$V_x=\frac{x}{L}V_{24}$$

where $x$ is the distance between electrode 24 and the edge of the electrode 14 closest to electrode 22; L is the length of the body 12; and $V_{24}$ is the voltage at the electrode 24. With this bias arrangement, a current of majority charge carriers flows through the crystal between the electrodes 22 and 24 due to the battery 26. However, only a very small current, the saturation current, flows through the P–N junction electrode 14. To cause charge injection from the P-type region 18 into the body, the voltage distribution must be changed so that the region 18 becomes slightly positive with respect to the portion of the body adjacent thereto.

Figure 2:
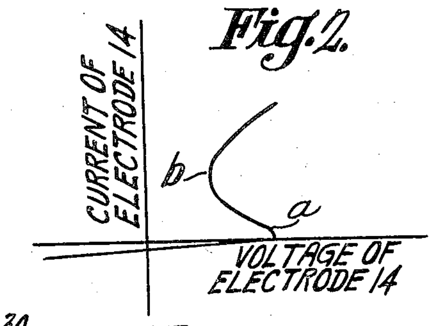
Fig. 2 is a graph showing a current vs. voltage characteristic curve for the device and circuit of Fig. 1.

Such a voltage unbalance may be achieved in numerous ways, for example, by the application of a signal voltage to the body 12 or to the electrode 14, by heating the body, or by directing radiation onto the body. For the purposes of this description, the voltage unbalance is achieved by means of a signal from a source 32 connected in series with the battery 26 between electrodes 22 and 24. When a signal, for example a negative pulse, from the source 32 is applied across the body, the region 18 becomes positive with respect to the body 12 and minority charge carriers, in this case holes, are injected into the crystal by electrode 14. This charge injection causes a substantial current flow through the external circuit connected to the electrode 14 and an output voltage appears across the load resistor 28. As the holes are injected into the crystal, they are drawn toward the grounded electrode 22 and the resistivity of the crystal in this region decreases and the potential of the crystal at the junction further decreases whereby the junction electrode becomes still more positive with respect to the crystal and more minority charge carriers are injected. This process of injection of charge and reduction in resistivity of the crystal is regenerative and is limited by the resistance in the circuit of the electrode 14, that is by the load resistor 28 and by the finite reduced resistance of the crystal in the region between the electrodes 22 and 14. The voltage-current characteristic for the P–N junction electrode 14 is shown in Fig. 2. The abscissa represents the voltage of the electrode 14 with respect to the body 12 and the ordinate represents the current flow from the electrode 14 into the body. Injection from the P–N junction electrode begins at point $a$ and the negative resistance portion of the curve lies between the points $a$ and $b$.

Figure 3:
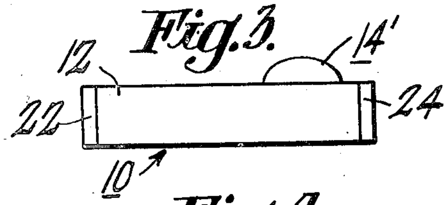
Fig. 3 is an elevational view of a modification of the device of Fig. 1.

Since the operation of the device 10 in Figure 1 depends primarily on the portion of the crystal 12 between the electrodes 14 and 22, the device may take the form shown in Figure 3 wherein, the electrode 14′ is positioned at the end of the crystal adjacent to electrode 24. The device 10 operated in the circuit of Figure 1 functions as a switch.

Figures 4, 6, 7:
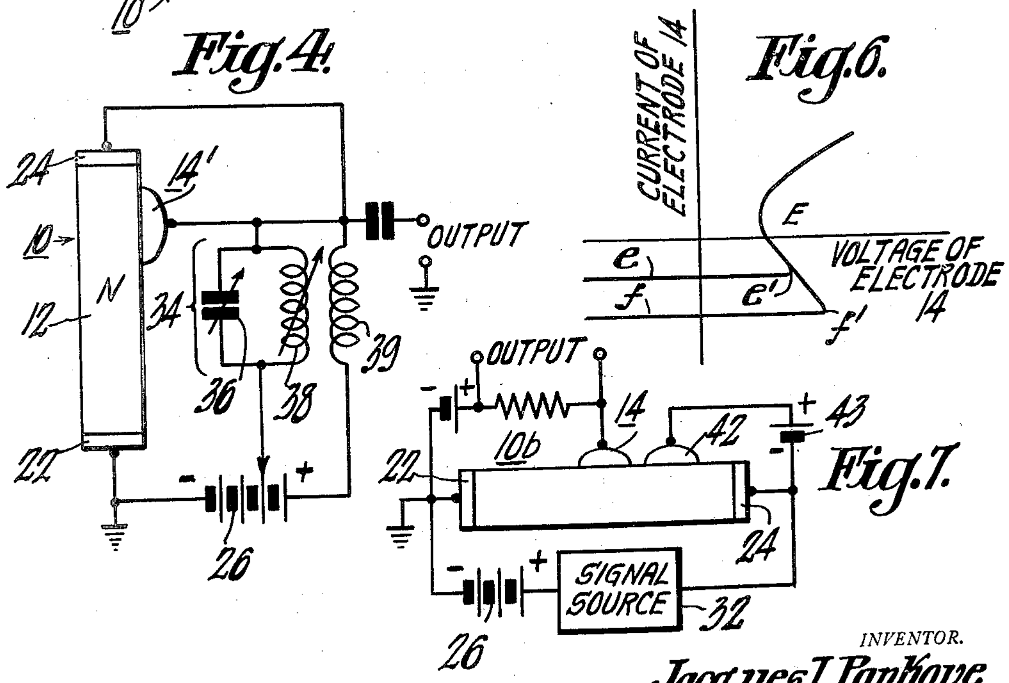
Fig. 4 is an elevational view of the device of Fig. 3 and a schematic diagram of a circuit in which it may be operated as an oscillator.
Fig. 6 is a graph showing a series of voltage vs. current characteristic curves for the device and circuit of Fig. 5.
Fig. 7 is an elevational view of a third embodiment of the device and a schematic diagram of a circuit of the invention.

Referring to Figure 4, the device 10, or the modification thereof shown in Figure 3, may be operated as an oscillator in a circuit which includes, in place of the load resistor 28, a tunable resonant circuit 34. The resonant circuit includes a capacitor 36 and an inductor 38, one or both of which may be tuned to determine the frequency of oscillation of the device as is well known in the art. The circuit may be arranged so that bias voltage for the electrode 14′ is obtained by a tap on the battery 26. The signal source 32 is omitted from this circuit and may be replaced by an inductor 39 coupled to the inductor 38 to provide feedback signals.

Figure 5:
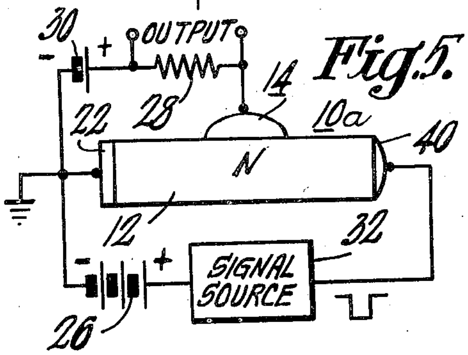
Fig. 5 is an elevational view of a second embodiment of the invention and a schematic diagram of a circuit in which it may be operated.

Referring to Figure 5, a modification of the invention comprises a device 10*a* having all of the elements of the device 10 except for non-rectifying electrode 24 which is replaced by a rectifying electrode, for example a P–N junction electrode 40. In operation of the device 10*a*, the electrode 40 is connected to the positive terminal of the battery 26 and, since it is thereby biased in the forward direction with respect to the body 12, the electrode 40 injects minority charge carriers into the crystal 12. These charge carriers flow to the electrode 22 and the rectifying electrode 14. The bias on electrode 14 and the voltage distribution along the crystal 12 due to the battery 26 are such that, initially, the electrode 14 is biased in the reverse direction with respect to the body and no charge injection occurs.

Since there is a larger concentration of minority charge carriers, in this case holes, in the body of the crystal 12 due to injection from the electrode 40, the reverse current flowing into the junction electrode 14 is larger than the saturation current in the device 10 represented by the portion of the curve of Figure 2 which is below the voltage axis. In this instance, referring to Figure 6, the reverse current is represented by the portion of the curve $e$ which is below the voltage axis. When the voltage distribution in the crystal 12 is altered as by a negative pulse from the source 32, the electrode 14 injects minority charge carriers and the characteristic negative-resistance effect results. The curve $f$ in Figure 6 represents the voltage-current characteristic of the electrode 14 when the current injected by the electrode 14 has some larger value than for the curve $e$ and the reverse current through electrode 14, represented by the portion of the curve $f$ below the voltage axis, accordingly is greater. The points $e'$ and $f'$ of the curves $e$ and $f$, respectively, at which the negative resistance characteristic is initiated vary with the voltage applied between the electrodes 40 and 24 by the battery 26. From the curves of Figure 6, it can be seen that the device 10*a* may be operated to provide both a substantial negative current and a substantial positive current.

Figures 8, 9:
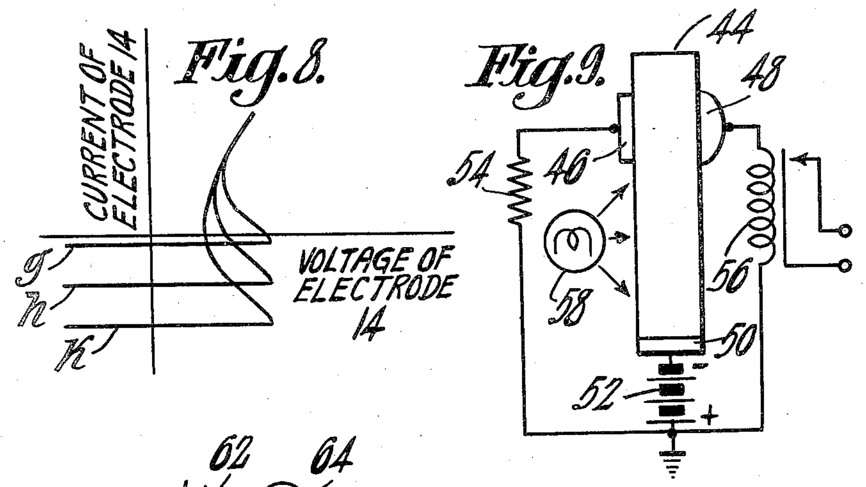
Fig. 8 is a graph showing a series of voltage vs. current characteristic curves for the device and circuit of Fig. 7.
Fig. 9 is an elevational view and schematic circuit diagram of a fourth embodiment of the invention operated as a photocell.

Referring to Figure 7, another modification of the invention includes a device 10*b* which combines certain features of the devices 10 and 10*a*. The device 10*b* includes all of the elements of the device 10 and has, in addition, an auxiliary P–N junction electrode 42 biased in the forward direction with respect to the crystal 12 and so positioned that minority charge carriers injected by it flow toward the electrode 14. Thus the electrode 42 is positioned at the end of the crystal adjacent to the non-rectifying eletcrode 24. In the device 10*b*, the junction electrode 42 controls the reverse current of the electrode 14 while the voltage between the ohmic electrodes 22 and 24 determines the range over which the negative resistance characteristic is exhibited. Characteristic curves $g$, $h$, and $k$ for the electrode 14 of the device 10*b* are shown in Figure 8. The curves $g$, $h$ and $k$ correspond respectively to operation at a larger value of current flow through the auxiliary electrode 42. Here again, the device may be operated to provide both positive and negative current.

The principles of the present invention may also be employed in a semiconductor photocell. Referring to Figure 9, such a device includes a semiconductor crystal 44, for example of N-type germanium having a non-rectifying electrode 46 which does not inject minority charge carriers and a rectifying electrode 48, for example an electrode forming a P–N junction with the crystal. The electrodes 46 and 48 may be positioned, for example, opposite each other at one end of the crystal. Another non-rectifying electrode 50 is attached to the crystal 44 at a position remote from the electrodes 46 and 48.

The circuit associated with the photo device of Figure 9 includes a battery 52, the negative terminal of which is connected to the electrode 50 and the positive terminal of which is connected through a resistor 54 to the non-rectifying electrode 46. The positive terminal of the battery 52 is also connected to ground and to the rectifying electrode 48 through a suitable load device 56 which may be, for example, the solenoid of a relay. The relative resistances of the resistor and the solenoid are such that the rectifying electrode 48 is initially biased in the reverse direction with respect to the semiconductor crystal and, accordingly, current does not flow from this electrode into the crystal 44. If the resistance of electrode 46 is sufficiently high to absorb some of the voltage of the battery 52, resistor 54 may be omitted.

In operation of the photo device, a source of radiation 58, which may be visible light, is focused on the semiconductor crystal, for example, on the portion thereof between the electrodes 46 and 50 and the resistance of this portion of the crystal is thereby reduced. If this reduction in resistance of the crystal is sufficiently large, the voltage drop through this crystal due to current flowing therein is reduced and the P–N junction electrode becomes biased in the forward direction with respect to the crystal. At this time, the P–N junction electrode injects minority charge carriers or holes into the crystal and the resistance of the crystal is further reduced. This mode of operation continues until the current flow from the P–N junction reaches a maximum value which is determined by the total resistance in the circuit of this electrode. When the light is removed, the initial conditions are restored and the P–N junction electrode returns to its relatively non-conducting state.

Figure 10:
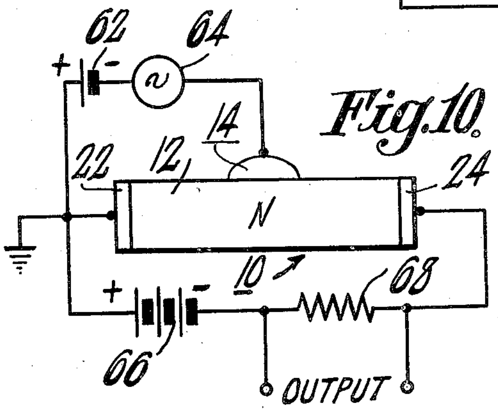
Fig. 10 is an elevational view of the device of Fig. 1 and a schematic diagram of a modified circuit in which it may be operated; and, Fig. 11 is an elevational view of the device of Fig. 10 and a schematic diagram of a modification of the circuit of Fig. 10.

The device shown in Figure 1 may be employed to provide a thyratron-type of action. For this purpose, referring to Figure 10, the negative terminal of a battery 62 is connected through a signal source 64 to the P–N junction electrode 14. The positive terminal of the battery 62 is connected to the electrode 22 and to ground. In addition, the negative terminal of a battery 66 is connected through a load device, e. g. a load impedance 68 to the electrode 24. The positive terminal of the battery 66 is connected to electrode 22 and to ground. These bias batteries are of such magnitude that the P–N junction electrode is biased in the reverse direction with respect to the crystal 12 so that this rectifying electrode does not inject minority charge carriers. To upset this initial voltage balance, a signal is applied to the P–N junction electrode. If the input signal is of the proper magnitude and of positive polarity, then the rectifying electrode 14 becomes biased in the forward direction with respect to the crystal. Thus biased in the forward direction, the electrode 14 injects minority charge carriers, in this case holes, which are drawn to the electrode 24. Hence, the resistance of the crystal between the rectifying electrode 14 and the electrode 24 is reduced by the injected holes and the voltage drop in this region decreases until the potential of the electrode 24 is substantially equal to the potential of the P–N junction electrode 14. Subsequently, a large current may flow in the load circuit of electrode 24 at a substantially constant voltage which corresponds to the potential of electrode 14.

This thyratron type of device may be employed as a non-continuous voltage regulator which is controlled by a low impedance voltage standard. The device stabilizes at the voltage of the selected standard which is connected to the rectifying electrode 14 and which constitutes the desired output voltage. The device may thus also be employed as a trigger pulse generator, as a switch, or as a voltage amplifier.

Figure 11:
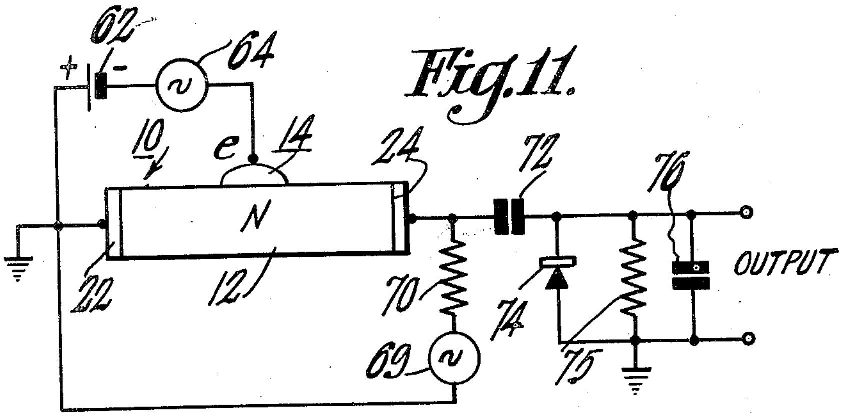

For operation of the thyratron embodiment of the invention as an amplifier, the circuit shown in Figure 11 may be employed. The signal source 64 and battery 62 are connected between the P–N junction electrode 14 and electrode 22 as in Figure 10. The circuit between the ohmic contact electrodes 22 and 24 includes a signal source 69 in series with a load impedance 70. The electrode 24 is also coupled by a coupling capacitor 72 to a detector circuit which includes a parallel combination of a rectifier 74, a resistor 75 and a capacitor 76 across which an output signal is developed. The resistor-capacitor network serves to filter out the signal from the source 69.

In the circuit of Figure 11, the battery 62 provides a bias voltage E, the source 64 provides a signal which produces a varying voltage $e$ at the electrode 14 and the source 69 provides a varying voltage V at electrode 24. The signal voltage V varies above and below the voltage $e$ of the electrode 14 so that the thyratron is fired as the electrode 14 is electrically biased in the forward direction with respect to the crystal 12. The thyratron is then cut off and reset when the voltage relationships are such that the electrode 14 is biased in the reverse direction with respect to the crystal 12. The source 69 may thus provide an alternating voltage which is either a sine wave, a square wave or any other form of wave which provides the desired voltage relationships.

It is desirable in all of the foregoing embodiments of the invention that the semiconductor crystal comprise comparatively high resistivity material of the order of 5 to 30 ohm-centimeters and comparatively high lifetime material having a lifetime above 50 microseconds. The lifetime depends on the size of the semiconductor crystal. With high lifetime semiconductor material, more of the length of the crystal can be affected by minority carrier injection and with high resistivity material a wider variation in resistivity can be affected by these carriers.

What is claimed is:

1. A semiconductor device comprising a filamentary body of semiconductor material, a first ohmic contact electrode in contact with one portion of said body, a second ohmic contact electrode in contact with another portion of said body, and a rectifying electrode in contact with said body and axially aligned along a common axis with said second ohmic electrode said common axis being transverse to the longitudinal axis of said body.

2. A semiconductor system comprising a body of semiconductor material of one conductivity type, means in contact with said body for applying a voltage across said body, a rectifying electrode in operative relation with said body, means for applying a bias to said rectifying electrode such that said electrode is biased in the reverse direction with respect to said body whereby said electrode does not inject minority charge carriers into said body, and a source of energy in operative relation with said body for varying the potential of said rectifying electrode with respect to said body such that minority charge carriers flow therefrom into said body.

3. A semiconductor system comprising a body of semiconductor material of one conductivity type, a pair of ohmic contact electrodes in contact with said body and adapted for applying a voltage across said body between said electrodes, a rectifying electrode in operative relation with said body, means for applying a bias to said rectifying electrode such that said electrode is biased in the reverse direction with respect to said body whereby said electrode does not inject minority charge carriers into said body, and electromagnetic wave means in operative relation with said body for varying the potential of said rectifying electrode with respect to said body and thereby causing injection of minority carriers therefrom into said body.

4. A semiconductor system comprising a body of semiconductor material of one conductivity type, a pair of ohmic contact electrodes in contact with said body and adapted for applying a voltage across said body between said electrodes, a rectifying electrode in operative relation with said body, means for applying a reverse bias to said rectifying electrode with respect to said body whereby said electrode does not inject a current of minority charge carriers into said body, and a signal source in operative relation with said body for changing the potential of said rectifying electrode with respect to said body and causing injection of minority charge carriers therefrom into said body.

5. The semiconductor system defined in claim 4 and wherein said rectifying electrode comprises a P–N junction electrode.

6. A semiconductor system comprising a body of semiconductor material of one conductivity type, a pair of electrodes spaced apart on said body in ohmic contact therewith, another electrode in rectifying contact with said body, said pair of electrodes defining the terminals of a current path in said body, one of said pair of electrodes being connected to ground and to the negative terminals of a first and a second bias voltage source, the other of said pair of electrodes being connected to the positive terminal of said first bias source, said other electrode being connected to the positive terminal of said second bias source, said sources being of such relative magnitude that said other electrode is biased in the reverse direction with respect to said body, and a signal source in operative relation with said body for changing the potential of said other electrode with respect to said body whereby said other electrode becomes biased in the forward direction.

7. A semiconductor oscillator comprising a body of semiconductor material, a pair of ohmic contact electrodes in contact with said body and adapted for applying a voltage across said body between said electrodes, a rectifying electrode in operative relation with said body, means for applying a reverse bias to said rectifying electrode with respect to said body whereby said electrode does not inject current of minority charge carriers into said body, a signal source in operative relation with said body for changing the potential of said rectifying electrode with respect to said body and causing injection of minority charge carriers therefrom into said body, and oscillatory electrical means interconnecting said rectifying electrode and one of said ohmic contact electrodes.

8. A semiconductor system comprising a body of semiconductor material, a non-rectifying electrode and a first rectifying electrode spaced apart on said body, means for biasing said first rectifying electrode in the forward direction with respect to said body, a second rectifying electrode in operative relation with said body, said second rectifying electrode being biased in the reverse direction with respect to said body whereby said electrode does not inject current of minority charge carriers into said body, and means for varying the potential of said second rectifying electrode with respect to said body to obtain a current flow of minority charge carriers therefrom into said body.

9. A semiconductor device comprising a body of semiconductor material, a pair of non-rectifying electrodes spaced apart and in contact with said body and adapted for applying a voltage along the length thereof, a first rectifying electrode in operative relation with said body, said first electrode being biased in the forward direction with respect to said body whereby minority charge carriers are injected into said body therefrom, a second rectifying electrode in operative relation with said body and means biasing said second rectifying electrode in the reverse direction with respect to said body whereby said second rectifying electrode does not inject minority charge carriers into said body, and means for varying the potential of said second electrode with respect to said body and thereby causing injection of minority charge carriers therefrom into said body.

10. A semiconductor system comprising a body of semiconductor material, means in contact with said body for applying a voltage across said body, a rectifying electrode in operative relation with said body, means biasing said rectifying electrode in the reverse direction with respect to said body whereby said electrode does not inject minority charge carriers into said body, and a source of radiation in operative relation with said body for changing the voltage distribution in said body and causing said rectifying electrode to assume a forward bias with respect to said body.

11. A semiconductor system comprising a body of semiconductor material, a pair of electrodes spaced apart on said body in ohmic contact therewith, another electrode in rectifying contact with said body, said pair of electrodes defining the terminals of a current path in said body, one of said pair of electrodes being connected to ground and to the positive terminals of a first and a second bias voltage source, the other of said pair of electrodes being connected to the negative terminal of said first bias source, said other electrode being connected to the negative terminal of said second bias source, said sources being of such relative magnitude that said other electrode is biased in the reverse direction with respect to said body, and a signal source in operative relation with said body for changing the potential of said other electrode whereby said other electrode becomes biased in the forward direction.

References Cited in the file of this patent

UNITED STATES PATENTS

| | | |
|---|---|---|
| 2,560,606 | Shive | July 17, 1951 |
| 2,569,347 | Shockley | Sept. 25, 1951 |
| 2,600,500 | Haynes et. al. | June 17, 1952 |
| 2,604,496 | Hunter | July 22, 1952 |
| 2,654,059 | Shockley | Sept. 29, 1953 |
| 2,669,635 | Pfann | Feb. 16, 1954 |
| 2,670,441 | McKay | Feb. 23, 1954 |
| 2,701,302 | Giacolletto | Feb. 1, 1955 |
| 2,792,499 | Mathis | May 14, 1957 |

OTHER REFERENCES

"Principles of Transistor Circuits," by Shea et al., John Wiley and Sons, New York, N. Y., September 15, 1953; pages 467–470, Figs. 21.23 and 21.27.